US012571091B2

(12) United States Patent
Susa et al.

(10) Patent No.: US 12,571,091 B2
(45) Date of Patent: Mar. 10, 2026

(54) METHOD FOR FORMING CARBON FILM AND FILM FORMING APPARATUS

(71) Applicant: ASM IP Holding B.V., Almere (NL)

(72) Inventors: Yoshio Susa, Tama (JP); Hirotsugu Sugiura, Tama (JP); Yoshiyuki Kikuchi, Tokyo (JP)

(73) Assignee: ASM IP Holding B.V., Almere (NL)

( * ) Notice: Subject to any disclaimer, the term of this patent is extended or adjusted under 35 U.S.C. 154(b) by 241 days.

(21) Appl. No.: 18/217,685

(22) Filed: Jul. 3, 2023

(65) Prior Publication Data

US 2024/0011151 A1 Jan. 11, 2024

Related U.S. Application Data

(60) Provisional application No. 63/358,674, filed on Jul. 6, 2022.

(51) Int. Cl.
| | |
|---|---|
| *C23C 16/26* | (2006.01) |
| *C23C 16/04* | (2006.01) |
| *H01L 21/311* | (2006.01) |

(52) U.S. Cl.
CPC ............ *C23C 16/26* (2013.01); *C23C 16/045* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 10,388,513 B1 | 8/2019 | Blanquart | |
| 10,755,922 B2 | 8/2020 | Blanquart | |
| 10,755,923 B2 | 8/2020 | Blanquart | |
| 11,282,698 B2 | 3/2022 | Blanquart | |
| 11,626,316 B2 | 4/2023 | Utsuno | |
| 11,646,197 B2 | 5/2023 | Blanquart | |
| 2019/0385907 A1 | 12/2019 | Gottheim | |
| 2020/0118815 A1* | 4/2020 | Fukazawa | H01L 21/02274 |
| 2020/0373152 A1 | 11/2020 | Blanquart | |
| 2021/0151348 A1* | 5/2021 | Utsuno | H01L 21/31122 |
| 2021/0238742 A1 | 8/2021 | Susa | |
| 2021/0366712 A1 | 11/2021 | Susa | |
| 2022/0251707 A1 | 8/2022 | Susa | |
| 2022/0336204 A1 | 10/2022 | Miyama | |
| 2022/0392765 A1* | 12/2022 | Han | H01L 21/02118 |

OTHER PUBLICATIONS

Wikipedia, "Noble gas" via https://en.wikipedia.org/wiki/Noble_gas ; pp. 1-25 (Year: 2025).*

* cited by examiner

*Primary Examiner* — Binh X Tran

(74) *Attorney, Agent, or Firm* — Snell & Wilmer L.L.P.

(57) ABSTRACT

A method for forming a carbon film on inner wall surfaces of a plurality of trenches which are formed on a substrate to be processed includes a depositing step of depositing the carbon film on the inner wall surfaces of the trenches of the substrate to be processed by supplying a mixed gas containing a carbon precursor gas and a carrier gas and applying a high frequency voltage to the mixed gas to generate plasma, an interval step of stopping the supply of the carbon precursor gas and the application of the high frequency voltage while continuing the supply of the carrier gas, and an etching step of etching a part of the carbon film by continuing to supply the carrier gas and applying a high frequency voltage to the carrier gas to generate plasma, wherein the above steps are repeated in the above order.

10 Claims, 5 Drawing Sheets

METHOD FOR FORMING CARBON FILM AND FILM FORMING APPARATUS

CROSS-REFERENCE TO RELATED APPLICATIONS

This application claims priority to U.S. Provisional Patent Application Ser. No. 63/358,674 filed Jul. 6, 2022 and titled METHOD FOR FORMING CARBON FILM AND FILM FORMING APPARATUS, the disclosure of which is hereby incorporated by reference in its entirety.

BACKGROUND OF THE INVENTION

Field of the Invention

The present disclosure relates to a method for forming a carbon film and a film forming apparatus.

Description of Related Art

In the manufacturing process of the NAND flash memory, a sacrificial layer is formed on an inner wall surface of trenches formed in the oxide-nitride-oxide-nitrite layer (ONON layer). The plasma CVD method is widely known as a method for forming the sacrificial layer. US Patent Application Publication No. 2019/0385907 discloses a method of forming a carbon film on the inner surface of the trenches by using a plasma CVD method.

In the NAND flash memory, the number of laminated ONON layers is increasing in order to improve the capacity, and the depth of the trench formed in the ONON layer is increased accordingly. The deeper the trench, the more difficult it is for the carbon film material (carbon precursor) to reach the bottom of the trench. Therefore, as the depth of the trench becomes deeper, the carbon film formed around the opening of the trench tends to become thicker, and the carbon film formed around the bottom of the trench tends to become thinner. Therefore, it becomes difficult to form a carbon film having a uniform thickness on the inner wall surface of the trenches.

SUMMARY OF THE INVENTION

A first aspect of the present disclosure provides a method for forming a carbon film on inner wall surfaces of a plurality of trenches which are formed on a substrate to be processed, including a depositing step of depositing the carbon film on the inner wall surfaces of the trenches of the substrate to be processed by supplying a mixed gas containing a carbon precursor gas and a carrier gas and applying a high frequency voltage to the mixed gas to generate plasma, an interval step of stopping the supply of the carbon precursor gas and the application of the high frequency voltage while continuing the supply of the carrier gas, and an etching step of etching a part of the carbon film by continuing to supply the carrier gas and applying a high frequency voltage to the carrier gas to generate plasma, wherein the above steps are repeated in the above order.

A second aspect of the present disclosure provides a film forming apparatus, including a chamber, a susceptor which is arranged in the chamber, and on which a substrate to be processed having a plurality of trenches is placed, a shower head arranged above the susceptor apart from each other, a high frequency power supply that applies a high frequency voltage between the susceptor and the shower head, a carbon precursor gas pipe and a carrier gas pipe connected to the shower head, and a controller, wherein, by adjusting the supply/stop of the carbon precursor flowing through the carbon precursor gas pipe, the supply/stop of the carrier gas flowing through the carrier gas pipe, and the ON/OFF of the high frequency power supply with the controller, the carbon film on the inner wall surfaces of the trenches of the substrate to be processed is deposited while supplying a mixed gas containing a carbon precursor gas and a carrier gas and applying a high frequency voltage to the mixed gas to generate plasma, the supply of the carbon precursor gas and the application of the high frequency voltage are stopped while continuing the supply of the carrier gas, a part of the carbon film is etched while continuing to supply the carrier gas and applying a high frequency voltage to the carrier gas to generate plasma, and these are repeated in the this order.

DETAILED DESCRIPTION OF THE INVENTION

Hereinafter, the present disclosure will be described in detail with reference to the drawings as appropriate. The drawings used in the following description may be enlarged for convenience in order to make the features of the present disclosure easy to understand, and the dimensional ratio of each component may differ from the actual one. The materials, dimensions, etc. exemplified in the following description are examples, and the present disclosure is not limited thereto and it is possible to appropriately change and implement the present disclosure within a range in which the effects of the present disclosure can be obtained.

Figure 1:
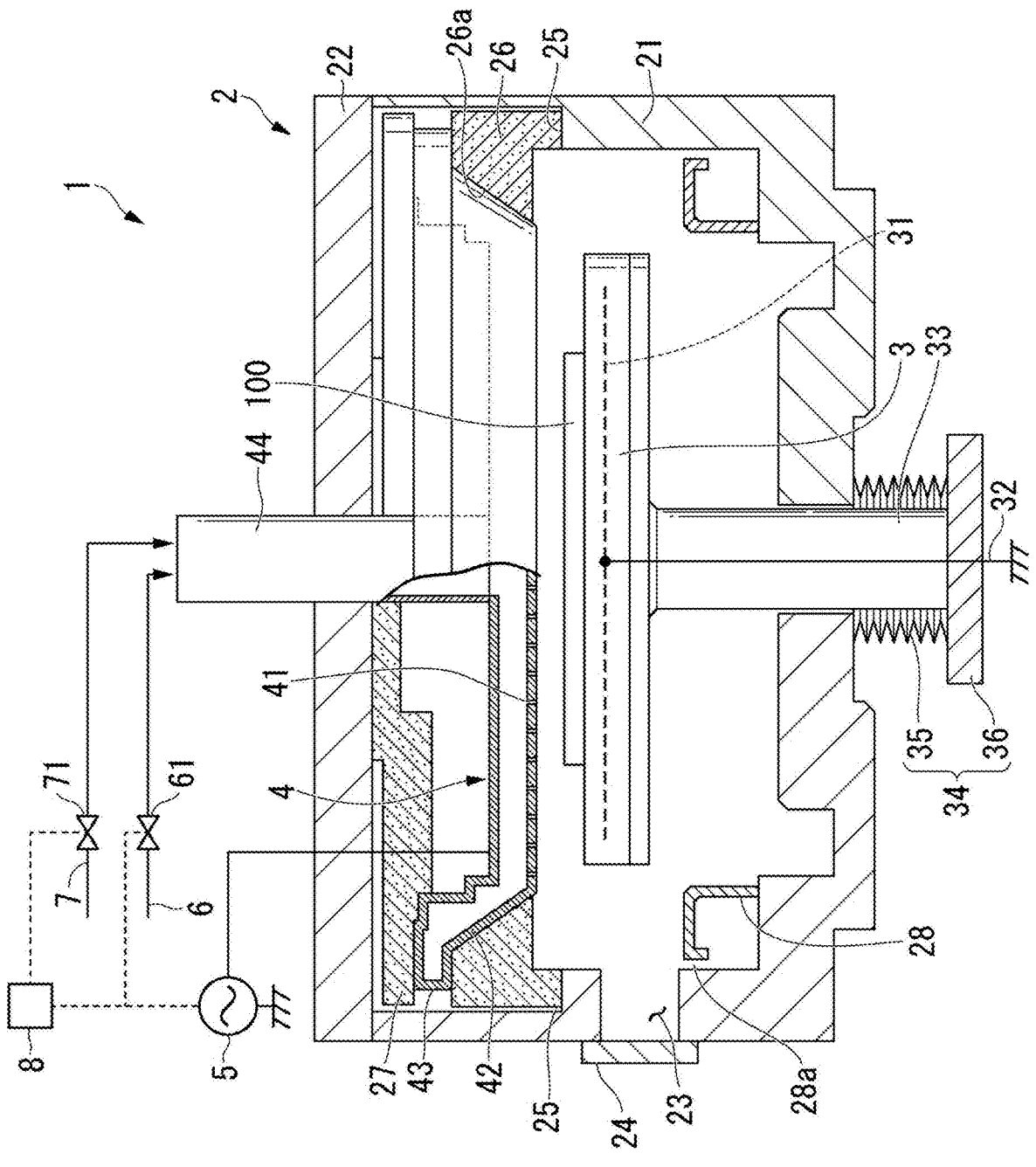
FIG. 1 is a cross-sectional view of a film forming apparatus according to an embodiment of the present disclosure.

FIG. 1 is a cross-sectional view of a film forming apparatus according to an embodiment of the present disclosure.

The film forming apparatus 1 shown in FIG. 1 has a chamber 2. The chamber 2 includes a susceptor 3 arranged inside and a shower head 4 arranged above the susceptor 3.

Further, the film forming apparatus 1 has a high frequency power supply 5, a carbon precursor gas pipe 6, a carrier gas pipe 7, and a controller 8.

The chamber 2 is a substantially cylindrical body. The chamber 2 has a chamber body 21 and a lid member 22. The chamber body 21 and the lid member 22 may be made of a metal material. As the metal material, for example, aluminum can be used.

An entry/takeout port 23 for a substrate 100 to be processed is provided on the side of the chamber body 21. The entry/takeout port 23 can be opened and closed by a door portion 24. A recess 25 is provided on the inner wall surface of the chamber body 21 above the entry/takeout port 23. A shower head fixing member 26 is arranged in the recess 25. The shower head fixing member 26 is a ring-shaped member having an inverted conical opening 26a having the lower inner diameter smaller than the upper inner diameter. As the material of the shower head fixing member 26, for example, a ceramic material such as $Al_2O_3$ can be used. A high frequency shielding plate 27 is arranged between the shower head 4 and the lid member 22. As the material of the high frequency shielding plate 27, for example, a ceramic material such as $Al_2O_3$ can be used.

An exhaust gas pipe 28 is arranged at the bottom of the chamber main body 21. The exhaust gas pipe 28 has an exhaust gas port 28a provided along the inner wall surface of the chamber main body 21. The gas introduced into the chamber 2 is discharged to the outside from an exhaust gas port (not shown) through the exhaust gas pipe 28.

The susceptor 3 is circular in a plan view. The surface of the susceptor 3 on the shower head 4 side is a mounting surface on which the substrate 100 to be processed is mounted. The susceptor 3 has an electrode 31 inside. The electrode 31 is connected to the ground wiring 32. The shape of the electrode 31 is, for example, a plate shape, a wire mesh shape, or a punching metal shape. As the material of the electrode 31, for example, a refractory metal such as tungsten, tantalum, molybdenum, niobium, ruthenium, and hafnium can be used. Further, the susceptor 3 may be provided with a heater (not shown) for heating the substrate 100 to be processed inside. The temperature of the susceptor 3 is not limited in the present disclosure, but it is preferable that the temperature can be adjusted within the range of 300° C. or higher and 1000° C. or lower.

The susceptor 3 is provided with a susceptor support portion 33 in the center opposite to the shower head 4 side. The material of the susceptor 3 and the susceptor support 33 is, for example, a ceramic such as alumina or aluminum nitride. An elevating device 34 is arranged at the end of the susceptor support portion 33 opposite to the susceptor 3 side. The elevating device 34 has a movable portion 35 that can be expanded and contracted in the vertical direction, and a support portion 36 that supports the susceptor support portion 33 and the movable portion 35. When the movable portion 35 extends downward, the susceptor support portion 33 and the susceptor 3 move downward, and when the movable portion 35 contracts upward, the susceptor support portion 33 and the susceptor 3 move upward. By moving the susceptor 3 to the position of the entry/takeout port 23 of the chamber main body 21, the substrate 100 to be processed can be taken in and out.

The shower head 4 has a plurality of through gas holes 41 on the lower surface facing the susceptor 3. The material of the shower head 4 is, for example, stainless steel. The side surface 42 of the shower head 4 is in contact with the opening 26a of the shower head fixing member 26. The flange portion 43 of the shower head 4 is sandwiched between the shower head fixing member 26 and the high frequency shielding plate 27. A gas introduction pipe 44 is connected to the central portion of the shower head 4 opposite to the susceptor 3 side.

The high frequency power supply 5 is connected to the shower head 4. By turning on the high frequency power supply 5, a high frequency voltage is applied between the shower head 4 and the susceptor 3. The frequency of the AC voltage supplied from the high frequency power supply 5 is, for example, in the range of 13.56 MHz or more and 60 MHz or less.

The carbon precursor gas pipe 6 and the carrier gas pipe 7 are connected to the gas introduction pipe 44 of the shower head 4.

The carbon precursor gas pipe 6 has a first valve 61 that adjusts the start and the stop of the supply of the carbon precursor gas. As the carbon precursor gas, for example, a gas of a compound represented by the following general formula (I) can be used:

$$CxHyOz \qquad\qquad (I)$$

(in the above general formula (I), x represents a number of 1 or more, y represents a number of 2 or more, and z represents a number of 0 or 1 or more.)

The compound represented by the general formula (I) may be a chain compound or a cyclic compound. The cyclic compound includes alicyclic compounds, aromatic compounds and heterocyclic compounds. Further, the compound represented by the general formula (I) may be a saturated compound or an unsaturated compound. Examples of the carbon precursor gas include methane ($CH_4$) gas, acetylene ($C_2H_2$) gas, propylene ($C_3H_6$) gas, cyclobutane ($C_4H_8$) gas, 1,3-dimethyladamantane ($C_{12}H_{20}$) gas, and bicyclo [2.2.1] hepta-2,5-diene (2,5-norbornadiene: $C_7H_8$) gas, adamantane ($C_{10}H_{16}$) gas, norbornene ($C_7H_{10}$) gas can be mentioned. These gases may be used alone or in combination of two or more.

The carrier gas pipe 7 has a second valve 71 that regulates the start and the stop of the carrier gas supply. As the carrier gas, for example, a rare gas can be used. The carrier gas may contain a reducing gas. Hydrogen gas can be used as the reducing gas. The carrier gas is not limited in the present disclosure, but is preferably an argon-hydrogen mixed gas or a helium-hydrogen mixed gas. These mixed gases may have a hydrogen content in the range of 30% by volume or more and 70% by volume or less.

The controller 8 is connected to the high frequency power supply 5 and controls the ON/OFF of the high frequency power supply 5. Further, the controller 8 is connected to the first valve 61 and controls the start/stop of the supply of the carbon precursor gas flowing through the carbon precursor gas pipe 6. Further, the controller 8 is connected to the second valve 71 and controls the start/stop of the supply of the carrier gas flowing through the carrier gas pipe 7.

Next, a carbon film forming method using the above-mentioned film forming apparatus 1 will be described. The carbon film forming method of the present embodiment is a method for forming a carbon film on the inner wall surface of the trenches of the substrate 100 to be processed having a plurality of trenches. The substrate 100 to be processed is, for example, a silicon substrate. The shape of the trench of the substrate 100 to be processed is not particularly limited, and for example, the shape of the opening of the trench may be circular or polygonal. The average aspect ratio of the plurality of trenches of the substrate 100 to be processed (average depth of trenches/average longest diameter of the openings of the trenches) may be, for example, in the range of 0.5 or more and 15 or less or in the range of 2 or more and 15 or less. Further, the average longest diameter of the trench opening may be, for example, in the range of 10 nm or more and 300 nm or less.

Figure 2:
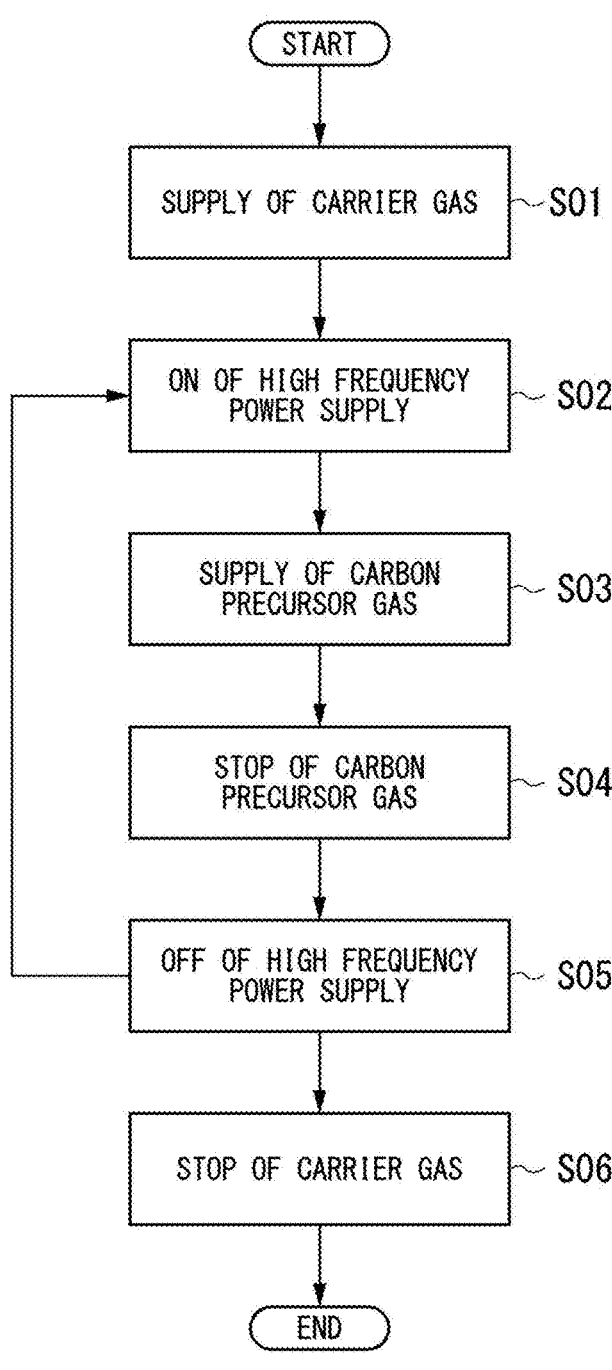
FIG. 2 is a flow chart of a carbon film forming method according to an embodiment of the present disclosure.
Figure 3:
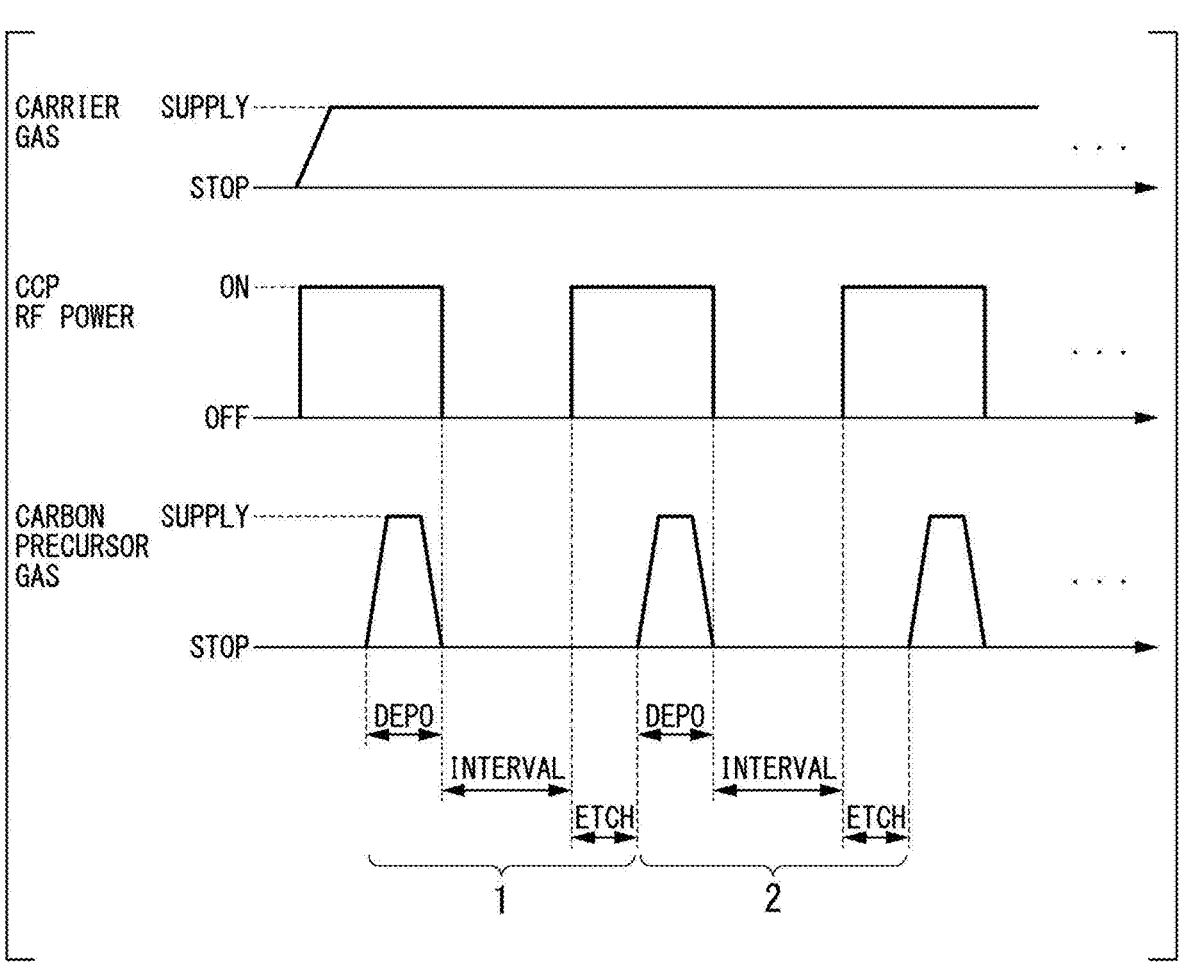
FIG. 3 is a timetable for supplying/stopping the carrier gas, turning ON/OFF the high frequency power supply, and supplying/stopping the carbon precursor gas in the carbon film forming method according to an embodiment of the present disclosure.

FIG. 2 is a flow chart of a carbon film forming method according to an embodiment of the present disclosure, and FIG. 3 is a timetable for supplying/stopping the carrier gas, turning ON/OFF of the high frequency power supply, and supplying/stopping the carbon precursor gas.

As shown in FIG. 2, the carbon film forming method includes a carrier gas supply operation S1, a high frequency power supply ON operation S2, a carbon precursor gas supply operation S3, a carbon precursor gas stop operation S4, a high frequency power OFF operation S5, and the carrier gas stop operation S6. These operations are performed by the controller 8 controlling the ON/OFF of the high frequency power supply 5, the start/stop of the supply of the carbon precursor gas, and the start/stop of the supply of the carrier gas. Before the carrier gas supply operation S1, the internal pressure of the chamber is not limited in the present disclosure, but is preferably adjusted within the range of 100 Pa or more and 1500 Pa or less.

In the carrier gas supply operation S1, the second valve 71 is opened to start supplying the carrier gas flowing through the carrier gas pipe 7. By this operation S1, the carrier gas is supplied to the shower head 4 through the gas introduction pipe 44. The carrier gas supplied to the shower head 4 is discharged toward the substrate 100 to be processed mounted on the susceptor 3 through the through gas holes 41.

In the high frequency power supply on operation S2, the carrier gas plasma is generated by applying the high frequency voltage.

In the carbon precursor gas supply operation S3, the first valve 61 is opened to start the supply of the carbon precursor gas flowing through the carbon precursor gas pipe 6. By this operation S3, a mixed gas of the carbon precursor gas and the carrier gas is supplied to the shower head 4 through the gas introduction pipe 44. The mixed gas supplied to the shower head 4 is discharged to the substrate 100 side to be processed mounted on the susceptor 3 through the through gas holes 41. A high frequency voltage is applied to the discharged mixed gas to generate plasma, and a carbon film is formed on the inner wall surface of the trenches of the substrate 100 to be processed (deposition step).

In the carbon precursor gas stop operation S4, the first valve 61 is closed to stop the supply of the carbon precursor gas flowing through the carbon precursor gas pipe 6. This stops the formation of the carbon film.

In the high frequency power supply OFF operation S5, the high frequency power supply is turned off. As a result, plasma generation is stopped (interval step).

The carbon precursor gas stop operation S4 and the high frequency power supply OFF operation S5 may be performed at the same time.

In the carrier gas stop operation S6, the second valve 71 is closed to stop the supply of the carbon precursor gas flowing through the carrier gas pipe 7.

In the carbon film forming method of the present embodiment, the operations from the high frequency power supply on operation S2 to the high frequency power supply OFF operation S5 are repeated until a carbon film having a desired thickness is obtained.

When the carrier gas plasma is generated with the high frequency power supply 5 turned on in the second and subsequent high frequency power supply ON operations S2, the carbon film formed on the surface of the substrate 100 to be processed and around the opening of the trench is etched (etching step). By etching the carbon film formed around the opening of the trench, the difference between the thickness of the carbon film formed around the opening of the trench and the thickness of the carbon film formed around the bottom of the trench becomes small.

As shown in FIG. 3, in the carbon film forming method of the present embodiment, the deposition step, the interval step, and the etching step are performed in order. The deposition step is a step in which a carrier gas supply operation S1, a high frequency power supply ON operation S2, and a carbon precursor gas supply operation S3 are performed to supply a mixed gas containing the carbon precursor gas and the carrier gas and to apply a high frequency voltage to the mixed gas to generate plasma to form a carbon film on the inner wall surface of the trenches of the substrate 100 to be processed. The interval step is a step in which the carbon precursor gas stop operation S4 and the high frequency power supply OFF operation S5 are performed to stop the supply of the carbon precursor gas and the application of the high frequency voltage while continuing the supply of the carrier gas. The etching step is a step in which the high frequency power supply ON operation S2 is performed after the high frequency power supply OFF operation S5 while continuing to supply the carrier gas, to apply a high frequency voltage to the carrier gas to generate plasma and to etch a part of the carbon film. In this etching step, the carbon film formed mainly on the surface and around the openings of the trenches of the substrate 100 to be processed is etched.

When the time of the depositing step is 1.0, the time of the interval step may be, for example, in the range of 0.5 or more and 4.0 or less, and the time of the etching step may be, for example, in the range of 0.5 or more and 2.0 or less. The time of the depositing step may be, for example, in the range of 1.0 second or more and 10.0 second or less. The time of the interval step may be, for example, in the range of 0.5 second or more and 40.0 second or less. The time of the etching step may be, for example, in the range of 0.5 second or more and 20.0 second or less. The time of the interval step is not limited in the present disclosure, but is preferably the same as or longer than the time of the etching step, and more preferably longer than the time of the etching step. It is particularly preferable that the time of the interval step is in the range of 1.5 or more and 3.0 or less, where the time of the etching step is 1.0. The time of the etching step is not limited in the present disclosure, but is preferably close to the time of the deposition step. The time of the etching step is particularly preferably in the range of 0.8 or more and 1.2 or less, where the time of the deposition step is 1.0.

According to the film forming method of the present embodiment having the above constitution, since the interval step is included between the deposition step and the etching step, a carbon film having a uniform thickness can be formed on the inner wall surface regardless of the depth of the trench and the size of the opening. This is because the active species of the mixed gas generated in the deposition step acts to partially etch the carbon film formed on the inner wall surface of the trenches of the substrate 100 to be processed in the deposition process, and in the subsequent etching process, the carbon film formed on formed on the surface and around the openings of the trenches of the substrate 100 to be processed is partially etched, and as a result, the difference between the thickness of the carbon film at the opening and the bottom of the trench become small. Therefore, the film forming method of the present embodiment is useful as a method for forming a carbon film (sacrificial layer) in the manufacturing process of the NAND flash memory.

According to the film forming apparatus 1, the controller 8 controls the start/stop of the supply of the carbon precursor gas flowing the carbon precursor gas pipe 6, and the start/stop of the supply of the carrier gas flowing the carrier gas pipe 7, and the ON/OFF of the high frequency power supply 5, and for this, the deposition step, the interval step and the etching step can be easily performed. Therefore, the film forming apparatus 1 of the present embodiment can be advantageously used as an apparatus for forming a carbon film in the manufacturing process of the NAND flash memory.

EXAMPLES

Example 1

A silicon substrate, in which deep trenches with a maximum diameter of 28 nm and a depth of 93 nm (aspect ratio: 3.4) and shallow trenches with a maximum diameter of 24 nm and a depth of 110 nm (aspect ratio: 4.5) were alternately formed at intervals of 20 nm, was prepared. This silicon substrate was placed on the susceptor of the film forming apparatus. The temperature of the susceptor was set to 500° C. After depressurizing the inside of the chamber to make the internal pressure of the chamber 1100 Pa, an argon-hydrogen mixed gas was supplied to the shower head as a carrier gas. Next, with the high frequency power turned on, a high frequency voltage with a frequency of 13.56 MHz is applied between the shower head and the susceptor to generate plasma of an argon-hydrogen mixed gas, and then the supply of $C_3H_6$ gas as a carbon precursor gas was started (deposition process). After performing the deposition step for 2 seconds, the supply of propylene gas was stopped, and the high frequency power supply was turned off to stop the application of the high frequency voltage (interval step). After performing the interval step for 4 seconds, the high frequency power was turned on and a high frequency voltage was applied to the argon-hydrogen mixed gas to generate plasma (etching step). After performing the etching step for 2 seconds, the supply of propylene gas as a carbon precursor gas was started (deposition step). The deposition process was performed for 2 seconds, the interval process was performed for 4 seconds, and the etching process was performed for 2 seconds as one cycle, and 500 cycles were performed. The cross sections of the silicon substrate after 100 cycles, 300 cycles, and 500 cycles were observed using SEM (scanning electron microscope). In the SEM observation, platinum was applied to the surface of the silicon substrate to form a platinum film in order to make it easier to confirm the interface of the silicon substrate.

Figure 4A:
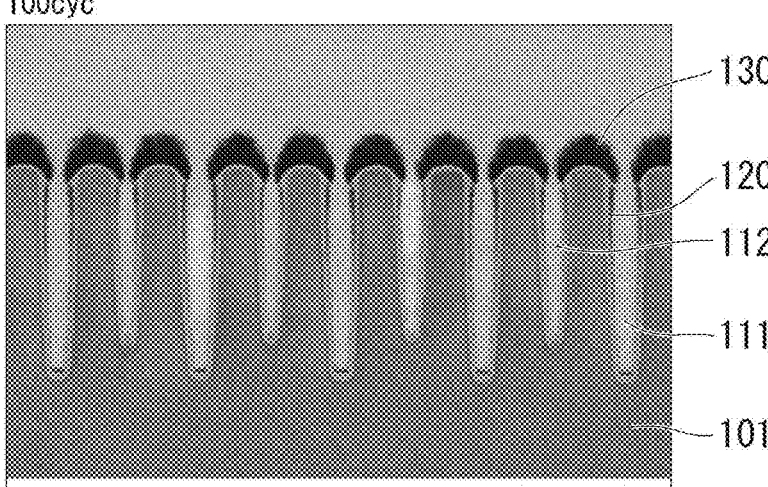
FIG. 4A is an SEM image of a silicon substrate after 100 cycles of performing a deposition step, an interval step, and an etching step in Example 1.
Figure 4B:
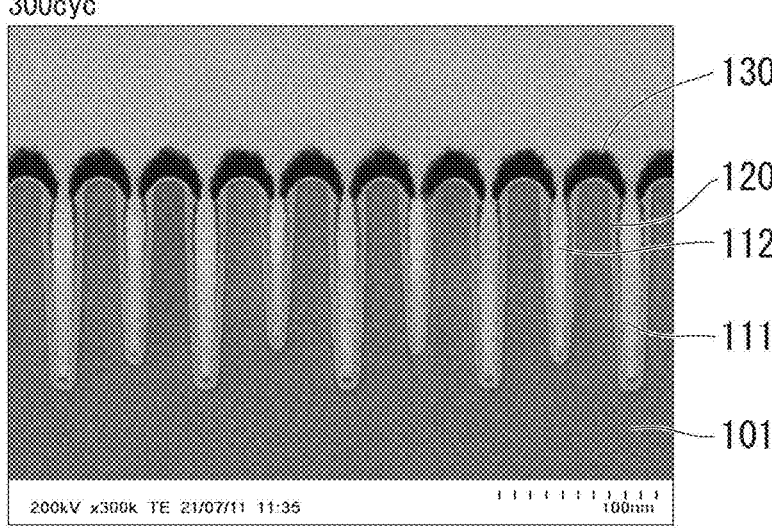
FIG. 4B is an SEM image of a silicon substrate after 300 cycles of performing a deposition step, an interval step, and an etching step in Example 1.
Figure 4C:
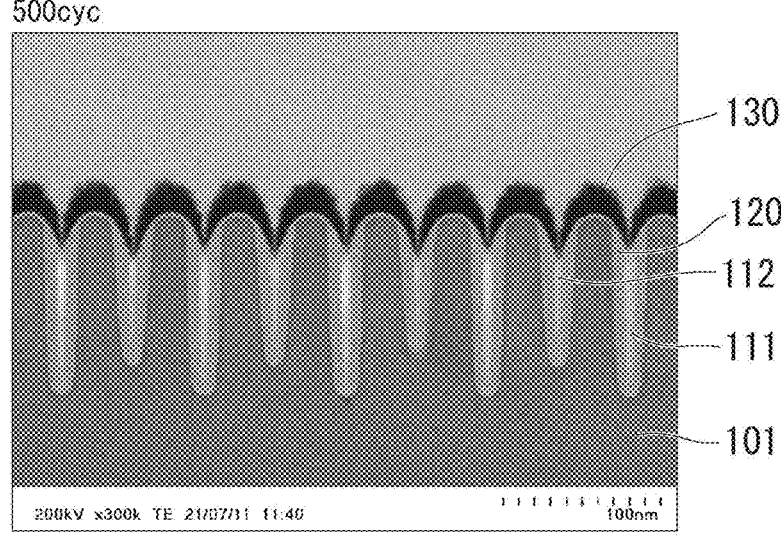
FIG. 4C is an SEM image of a silicon substrate after 500 cycles of performing a deposition step, an interval step, and an etching step in Example 1.

The results of SEM observation are shown in FIGS. 4A to 4C. FIG. 4A is an SEM image after 100 cycles, FIG. 4B is an SEM image after 300 cycles, and FIG. 4C is an SEM image after 500 cycles. In FIGS. 4A to 4C, reference number 101 is a silicon substrate, reference number 111 is a deep trench, reference number 112 is a shallow trench, reference number 120 is a carbon film, and reference number 130 is a platinum film formed on the surface of the silicon substrate 101.

From the results of FIGS. 4A to 4C, as the number of cycles increases, the thickness of the carbon film 120 of the deep trench 111 and the shallow trench 112 increases, and the carbon film 120 is hardly formed on the surface of the silicon substrate 101. Further, it can be seen that the carbon film 120 is uniformly formed on the inner wall surfaces of the deep trench 111 and the shallow trench 112, respectively. From this result, it was confirmed that the carbon film can be formed with a uniform thickness on the inner wall surface of the trenches having different depths by the method according to the carbon film forming method of the present disclosure.

Example 2

A silicon substrate, in which wide trenches with a maximum diameter of 148 nm and a depth of 298 nm (aspect ratio: 2.0) and narrow trenches with a maximum diameter of 77 nm and a depth of 268 nm (aspect ratio: 4.5) were alternately formed at intervals of 120 nm, was prepared. Under the same conditions as in Example 1 except that this silicon substrate was used, the deposition process was performed for 2 seconds, the interval process was performed for 4 seconds, and the etching process was performed for 2 seconds as one cycle, and 500 cycles were performed. The cross sections of the silicon substrate after 100 cycles, 300 cycles, and 500 cycles were observed using SEM (scanning electron microscope) in the same manner as in Example 1.

Figure 5A:
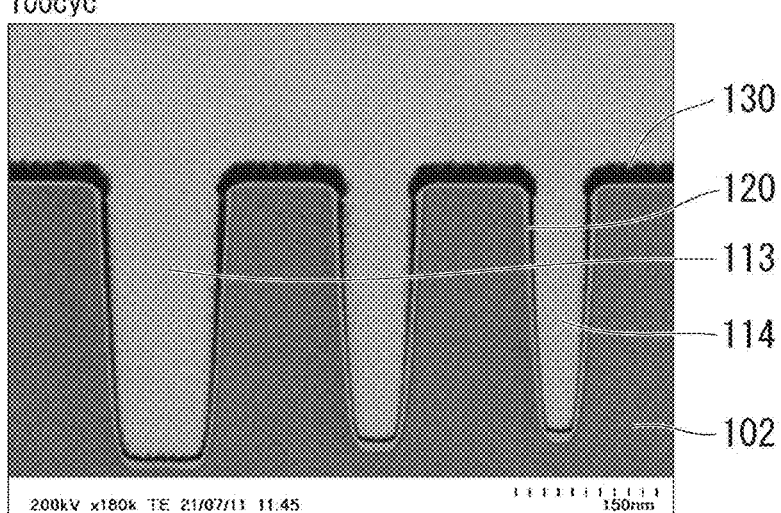
FIG. 5A is an SEM image of a silicon substrate after 100 cycles of performing a deposition step, an interval step, and an etching step in Example 2.
Figure 5B:
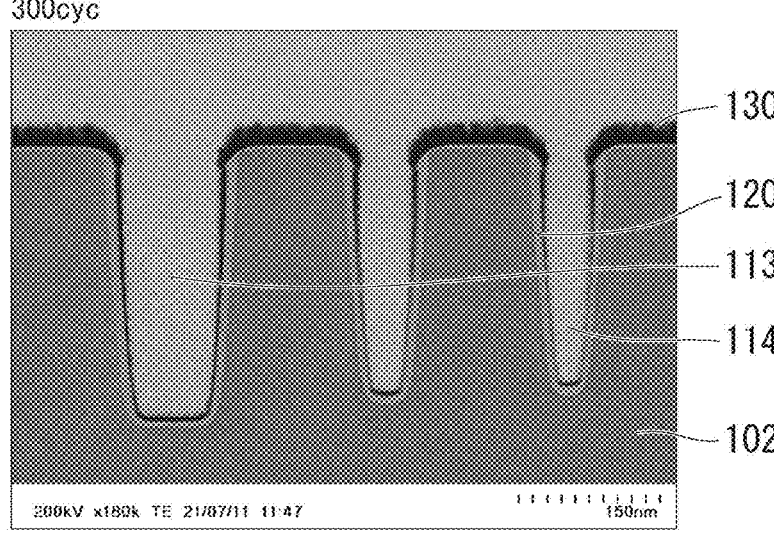
FIG. 5B is an SEM image of a silicon substrate after 300 cycles of performing a deposition step, an interval step, and an etching step in Example 2.
Figure 5C:
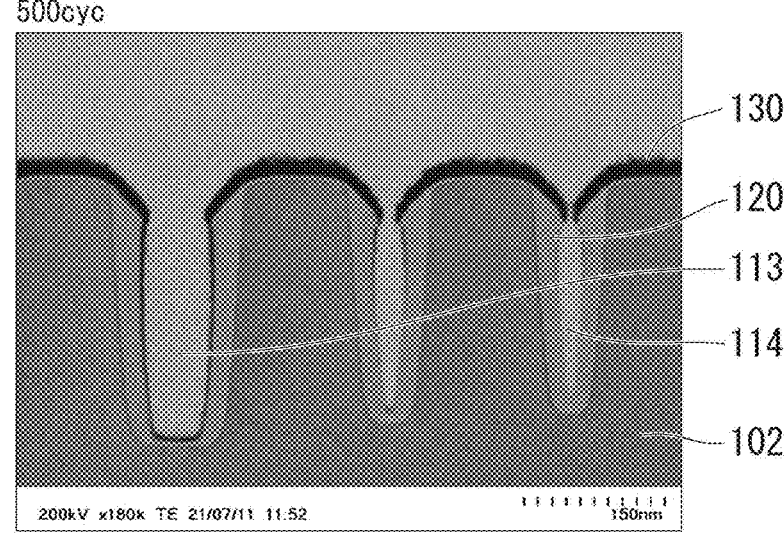
FIG. 5C is an SEM image of a silicon substrate after 500 cycles of performing a deposition step, an interval step, and an etching step in Example 2.

The results of SEM observation are shown in FIGS. 5A to 5C. FIG. 5A is an SEM image after 100 cycles, FIG. 5B is an SEM image after 300 cycles, and FIG. 5C is an SEM image after 500 cycles. In FIGS. 5A to 5C, reference number 102 is a silicon substrate, reference number 113 is a wide trench, reference number 114 is a narrow trench, reference number 120 is a carbon film, and reference number 130 is a platinum film formed on the surface of the silicon substrate 102.

From the results of FIGS. 5A to 5C, as the number of cycles increases, the thickness of the carbon film 120 of the wide trench 113 and the narrow trench 114 increases, and the carbon film 120 is hardly formed on the surface of the silicon substrate 102. Further, it can be seen that the carbon film 120 is uniformly formed on the inner wall surfaces of the wide trench 113 and the narrow trench 114, respectively. From this result, it was confirmed that the carbon film can be formed with a uniform thickness on the inner wall surface of the trenches having different maximum average diameters of the openings thereof by the method according to the carbon film forming method of the present disclosure.

What is claimed is:

1. A method for forming a carbon film on inner wall surfaces of a plurality of trenches which are formed on a substrate to be processed, comprising:

a depositing step of preferentially depositing the carbon film on the inner wall surfaces of the trenches of the substrate, relative to a top surface of the substrate, by supplying a mixed gas containing a carbon precursor gas and a carrier gas and applying a high frequency voltage to the mixed gas to generate plasma;

an interval step of stopping the supply of the carbon precursor gas and the application of the high frequency voltage while continuing the supply of the carrier gas; and, an etching step of etching a part of the carbon film by continuing to supply the carrier gas and applying the high frequency voltage to the carrier gas to generate plasma, wherein the above steps are repeated in the above order, wherein the carbon precursor gas is a gas of a compound represented by the following general formula:

$$CxHyOz,$$

where x represents a number of 1 or more, y represents a number of 2 or more, and z represents a number of 0 or more, and wherein a frequency of the high frequency voltage is 13.56 MHz or more and 60 MHz or less.

2. The method for forming a carbon film according to claim 1, wherein, when the time to perform the depositing step is 1.0, the time to perform the interval step is in the range of 0.5 or more and 4.0 or less, and the time to perform the etching step is in the range of 0.5 or more and 2.0 or less.

3. The method for forming a carbon film according to claim 1, wherein the carrier gas is an argon-hydrogen mixed gas or a helium-hydrogen mixed gas.

4. The method for forming a carbon film according to claim 1, wherein a duration of the interval step is the same as or longer than a duration of the etching step.

5. The method for forming a carbon film according to claim 1, wherein the deposition step is performed under a pressure of 100 Pa or more and 1500 Pa or less.

6. The method for forming a carbon film according to claim 1, wherein the average aspect ratio of the plurality of trenches of the substrate to be processed is in the range of 0.5 or more and 3.0 or less, and the average longest diameter of the openings of the trenches is in the range of 10 nm or more and 500 nm or less.

7. The method for forming a carbon film according to claim 1, wherein the high frequency voltage is continuous during the etching step and a subsequent depositing step.

8. The method for forming a carbon film according to claim 1, wherein the temperature of a susceptor on which the substrate to be processed is placed is set in the range of 300° C. to 800° C.

9. The method for forming a carbon film according to claim 1, a plasma power is on prior to supplying the carbon precursor gas and continues during the supplying the carbon precursor gas.

10. The method for forming a carbon film according to claim 1, wherein the etching step occurs immediately before the depositing step.

\* \* \* \* \*